United States Patent
Lu

(10) Patent No.: US 8,423,341 B2
(45) Date of Patent: Apr. 16, 2013

(54) METHOD AND SYSTEM FOR CONSTRUCTING CORNER MODELS FOR MULTIPLE PERFORMANCE TARGETS

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 12/581,208

(22) Filed: Oct. 19, 2009

(65) Prior Publication Data

US 2011/0093242 A1    Apr. 21, 2011

(51) Int. Cl.
*G06F 17/50* (2006.01)
*G06F 7/60* (2006.01)
*G06F 17/10* (2006.01)

(52) U.S. Cl.
USPC .................... 703/14; 703/2; 716/106

(58) Field of Classification Search .............. 703/2, 14
See application file for complete search history.

(56) References Cited

U.S. PATENT DOCUMENTS

| | | | |
|---|---|---|---|
| 6,330,526 B1 * | 12/2001 | Yasuda | 703/2 |
| 6,606,729 B2 * | 8/2003 | Gross et al. | 716/50 |
| 6,901,570 B2 | 5/2005 | Lu | |
| 7,937,252 B2 * | 5/2011 | Onodera et al. | 703/2 |

OTHER PUBLICATIONS

Lu, Ning, "Optimal Skew Corners for Compact Models", Paper, NSTI-Nanotech 2007, vol. 3, pp. 566-569, May 24-27, 2007.*
Lu, Ning, "Optimal Skew Corners for Compact Models", Power Point Presentation, 2007 Nanotech/WCM, 2007.*
Sengupta et al, "Application Specific Worst Case Corners Using Response Surfaces and Statistical Models", IEEE Transactions on Computer-Aided Design of Integrated Circuits and Systems, vol. 24, No. 9, Sep. 2005.*
Dharchoudhury et al, "Worst-Case Analysis and Optimization of VLSI Circuit Performances", IEEE Transactions on Computer-Aided Design of Integrated Circuits and Systems, vol. 14, No. 4, Apr. 1995.*

* cited by examiner

*Primary Examiner* — Mary C Jacob
(74) *Attorney, Agent, or Firm* — Schmeiser, Olsen & Watts; Richard Kotulak

(57) ABSTRACT

A method, system and article of manufacture are disclosed for constructing corner models for multiple performance targets for circuit simulations. The method includes identifying N ($N \geq 2$) performance targets $F_1, F_2, \ldots, F_N$, and obtaining their correlation matrix R, calculating a normalized joint probability density (JPD); and building a common and optimal corner for the N targets. The method further includes constructing corner models to cover both lower and upper bounds of the performance targets; and determining an optimal common corner solution for each corner by maximizing a normalized JPD among all possible common corner solutions for that corner.

20 Claims, 7 Drawing Sheets

$|df_1| = |df_2| = |df_3| = 1$ $r_{13} = df_1 \cdot df_3 = \cos(2\varphi)$
or
$r_{13} = df_1 \cdot df_3 = \cos(2\pi - 2\varphi)$ $r_{12} = df_1 \cdot df_2 = h \cos\varphi$ $r_{23} = df_2 \cdot df_3 = h \cos\varphi$ $r_{12} = r_{23}$ $r_{12}^2 = h^2 \cos^2\varphi = h^2 [1 + \cos(2\varphi)] / 2 = h^2 (1 + r_{13}) / 2 \leq (1 + r_{13}) / 2$ $df_1 = df_3$ when $r_{13} = 1$ $r_{12} = df_1 \cdot df_2 = \cos\varphi$ $r_{23} = df_2 \cdot df_3 = \cos\varphi$ so $r_{12} = r_{23}$

METHOD AND SYSTEM FOR CONSTRUCTING CORNER MODELS FOR MULTIPLE PERFORMANCE TARGETS

BACKGROUND OF THE INVENTION

1. Field of the Invention

This invention generally relates to computer-aided design of electronic circuits, and more specifically, the invention relates to constructing corner models for multiple performance targets.

2. Background Art

Computer aids for electronic circuit designers are becoming more and more popular. Examples of these computer aids include electronic circuit simulators such as the Simulation Program with Integrated Circuit Emphasis (SPICE) developed at the University of California, Berkeley (UC Berkeley), and various enhanced versions or derivatives of SPICE, such as, SPICE2 or SPICE3, HSPICE, PSPICE, and SPECTRE.

An electronic circuit may contain circuit elements such as resistors, capacitors, inductors, mutual inductors, transmission lines, diodes, bipolar junction transistors (BJT), junction field effect transistors (JFET), and metal-on-silicon field effect transistors (MOSFET), etc. A SPICE circuit simulator is a program that simulates the performance of electronic circuits. SPICE solves sets of non-linear differential equations in the frequency domain, steady state and time domain and can simulate the behavior of transistor and gate designs. In SPICE, a circuit is handled in a node/element fashion, i.e., the circuit is regarded as a collection of various elements (transistors, resistors, capacitors, etc.) and the elements are connected at nodes. Thus, each element must be modeled in order to simulate the entire circuit. Most SPICE circuit simulators have built in models for modeling semiconductor devices, and are set up so that the user need only specify model parameter values associated with the models.

Whether it is built-in or plug-in, a device model for a SPICE circuit simulator typically includes model equations and a set of model parameters, which are used to mathematically represent device characteristics of a device element under various bias conditions. For example, for a MOSFET device model, in DC and AC analysis, the inputs of the device model are the drain-to-source, gate-to-source, bulk-to-source voltages, and the device temperature, and the outputs are the various terminal currents. Therefore, the model parameters, along with the model equations in the device model, directly affect the final outcome of the terminal currents.

Compact/Spice models typically support Monte Carlo simulations. To reduce simulation time, however, it is desirable to also have a corner model. The corner model refers to a model wherein some of the varying electrical characteristics of a device show a lower frequency of occurrence than statistical typical values (average values, median values and the like) are expressed as corners, which define the limits of the variations. At the corners, to what extent the variations in model parameters and process parameters are tolerated is calculated.

Often it is desirable to find a common corner for multiple performance targets. For example, in FET corner models, a corner to meet both drain current and threshold voltage corner conditions at both short and long channel lengths. In a corner model aimed at circuit performance targets, it is desirable to have a common corner model for multiple logic gates, like ring oscillator, NAND, NOR, etc.

In another example, there are $N_1$ logic circuits/standard cells and, for each one, there is a 3-σ maximum delay requirement and a 3-σ maximum power/leakage requirement. We want to build a set of corner models to satisfy a total of $N=2N_1$ requirements. This can be done by (i) building N separate corner models (one corner model to cover one corner), (ii) building one common corner model to cover all N corners, or (iii) building $J(1<J<N)$ corner models ($1^{st}$ corner model covers $n_1$ corners, $2^{nd}$ corner model covers another $n_2$ corners, ..., $n_1+n_2+\ldots+n_J=N$). If successful and acceptable, (ii) is the most desirable solution and (i) is the least desirable solution. However, for (ii), there may not be a proper solution for such a common corner. Or, if there is a common corner, its probability can be too small. So the problem here is: How to decide how many corner models are needed in the suite of corner solution. Important considerations are, for each corner model in the suite of corner solution which of several performance corners to cover, and what criteria should be used to make such a decision.

In yet another example involving delay difference among different logic circuits (or among different paths), there are I logic circuits/standard cells and, for each one, there are both 3-σ maximum delay requirement and a 3-σ minimum delay requirement. We want to build a set of corner models to cover a total of $N=2I$ performance corners. In such an example, we have the freedom to choose the combinations of one circuit's maximum delay corner with another circuit's either maximum or minimum delay corner and build a common corner model to satisfy the chosen corners simultaneously. This can be done by (i) building N separate corner models (one corner model to cover one corner), or (ii) building $J(1<J<N)$ corner models ($1^{st}$ corner model covers $n_1$ corners, $2^{nd}$ corner model covers another $n_2$ corners, ..., $n_1+n_2+\ldots+n_J=N$). If successful and acceptable, the smaller the number (J) of the corner model is, the better the corner solution is. Again, the problem here is: How to decide how many corner models are needed in the suite of corner solution. Important issues are, for each corner model in the suite of corner solution, how do we choose a proper combination among maximum and minimum performance corners, and what criteria should be used to make such a decision.

SUMMARY OF THE INVENTION

A method of an embodiment of the invention includes the steps of (a) identifying $N(N\geq 2)$ device and/or circuit performance targets $F_1, F_2, \ldots, F_N$, and obtaining their correlation matrix R using Monte Carlo simulations, analyzing measured hardware data, or using the linear sensitivities of the N targets on M statistical model parameters; (b) calculating a normalized joint probability density (JPD); and (c) when $\eta_1, \ldots, \eta_N$ values are already set (each $\eta_j$ takes only one value), proceeding to build a common and optimal corner for N targets when $p(N) \geq p_{th}(N)$. The method includes the further steps of (d) constructing corner models to cover both lower and upper bounds of $1^{st}$ performance target to cover both lower and upper bounds of $N^{th}$ performance target; and (e) determining for each set of $I(1 \leq I \leq N)$ targets an optimal common corner solution for each corner by maximizing a normalized JPD among all possible common corner solutions for that corner.

In a preferred embodiment of the invention, the step of proceeding to build a common and optimal corner includes the steps of finding a largest set of (I) targets which has highest p(I) among $C_N^I=N!/[(N-I)!I!]$ combination of I targets and also satisfies $p(I) \geq p_{th}(I)$, then proceeding to build a common and optimal corner for set of I targets, when $p(N)<p_{th}(N)$ and task is to find one corner to cover as many targets as possible, and finding smallest number of (J) corners which can cover all N targets collectively. Also, in this preferred embodiment, the smallest number of corners may be found by finding a best allocation of N targets into J groups $(I_1+I_2+\ldots+I_J=N)$, and having $p(I_j) \geq p_{th}(I_j)$ for each group; and after finding this best allocation, proceeding to build one common and optimal corner for each group of performance targets, when $p(N) < p_{th}(N)$ and task is to cover all N targets.

The preferred embodiment of the invention, described below in detail, provides a number of important advantages. This embodiment of the invention provides a methodology to construct corner models for multiple performance targets. The invention gives a specific method of deciding for how many performance targets to construct a common corner. Namely, it provides a method to decide whether a corner model for multiple performance targets is suitable or not. The invention also provides a method of deciding for which several performance targets to construct a common corner, i.e., a method to select proper combinations among the upper and lower bounds of multiple performance targets.

More specifically, when a task is to build a corner model for multiple performance targets and, for each performance target, whether its corner is a lower or upper bound has also been specified, the invention provides (1a) an explicit expression for judging whether a suitable common corner exists or not. If there is not a suitable common corner, the invention further provides (1b) a method on how to find a corner solution in this case, and after (1a) and (1b), the invention further provides (1c) an optimal set corner models to satisfy the given multiple performance targets.

When a task is to build a set of corner models for multiple performance targets and, for each performance target, both its lower and upper bounds must be covered by the corner models, the invention provides (2a) an explicit expression to select proper combinations among the upper and lower bounds of multiple performance targets, and after (2a), the invention provides (2b) an optimal set of corner models to satisfy the given multiple performance targets. This optimal set of corner models achieves optimal combinations of the lower and upper bounds among the multiple performance targets.

In (1a), (1b), or in (2a), all that are needed are the correlation coefficients among multiple performance targets. Such correlation coefficients can be obtained in various ways, including running Monte Carlo simulations (in this approach, one does not need to know the number and/or names of statistical model parameters in the used SPICE model set, and does not need knowing the specific values of the sensitivities of any performance target on any statistical model parameters). In (1c) or in (2b), the invention preferably makes use of specific corner model solutions, which use the sensitivities of each performance target on statistical model parameters.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
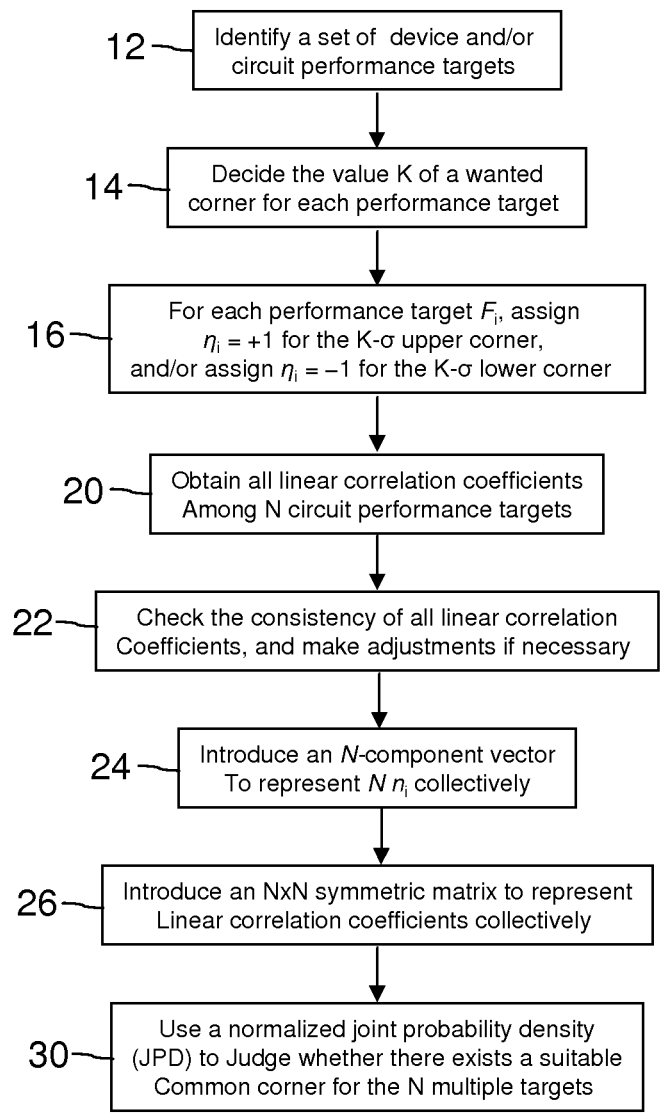
FIG. 1 is a flow chart showing steps of a preferred embodiment of this invention.

The present invention, generally, provides a methodology to construct corner models for multiple performance targets. The invention gives a specific method of deciding for how many performance targets to construct a common corner. Namely, it provides a method to decide whether a corner model for multiple performance targets is suitable or not. The invention also provides a specific method of deciding for which several performance targets to construct a common corner, i.e., a method to select proper combinations among the upper and lower bounds of multiple performance targets.

With a preferred embodiment of the invention, when a task is to build a corner model for multiple performance targets and, for each performance target, whether its corner is a lower or upper bound has also been specified, the invention provides (1a) an explicit expression for judging whether a suitable common corner exists or not. If there is not a suitable common corner, the invention further provides (1b) a method on how to find a corner solution in this case, and after (1a) and (1b), the invention further provides (1c) an optimal set corner models to satisfy the given multiple performance targets.

When a task is to build a set of corner models for multiple performance targets and, for each performance target, both its lower and upper bounds must be covered by the corner models, the invention provides (2a) an explicit expression to select proper combinations among the upper and lower bounds of multiple performance targets, and after (2a), the invention provides (2b) an optimal set of corner models to satisfy the given multiple performance targets. This optimal set of corner models achieves optimal combinations of the lower and upper bounds among the multiple performance targets.

In (1a), (1b), or in (2a), all that are needed are the correlation coefficients among multiple performance targets. Such correlation coefficients can be obtained in various ways, including running Monte Carlo simulations (in this approach, one does not need to know the number and/or names of statistical model parameters in the used SPICE model set, and does not need to know the specific values of the sensitivities of any performance target on any statistical model parameters).

The steps of the preferred embodiment are shown in FIG. 1 and described below with some examples.

Step 12 is to identify a set of device and/or circuit performance targets. We denote the number of targets as $N(N \geq 2)$ and represent N performance targets by $F_1, F_2, \ldots, F_N$. Step 14 is to decide the value K of a wanted corner for each performance target. For example, K=3 for a 3-σ corner value. Other K values could be 1, 2, 4, 5, 6, etc. For 1% or 99% accumulated probability, |K|=2.3; for 5% or 95% accumulated probability, |K|=1.6; for 10% or 90% accumulated probability, |K|=1.3. Step 16 is to, for each performance target $F_i$, assign $\eta_i=+1$ for the K-σ upper corner, and/or assign $\eta_i=-1$ for the K-σ lower corner. The accumulated probability of an upper corner is larger than 50%, and the accumulated probability of a lower corner is smaller than 50%.

Step 20 is to obtain all linear correlation coefficients among N circuit performance targets. The linear correlation coefficient between the $i^{th}$ and $k^{th}$ targets is $$r_{ik} = r_{ki} = \frac{\langle (F_i - \langle F_i \rangle)(F_k - \langle F_k \rangle) \rangle}{S_i S_k}, i, k = 1, 2, \ldots, N, \quad (1.1)$$

where $\langle F_i \rangle$ is the average value of the $i^{th}$ performance target $F_i$, and $S_i$ is the standard deviation of the $i^{th}$ performance target $F_i$, $$S_i = \sqrt{\langle (F_i - \langle F_i \rangle)^2 \rangle} = \sqrt{\langle F_i^2 \rangle - \langle F_i \rangle^2}, i = 1, 2, \ldots, N. \quad (1.2)$$

From Eqs. (1.1) and (1.2), it is easy to see that each diagonal element is unity, $$r_{ii}=1, i=1, 2, \ldots, N. \quad (1.3)$$

The number of (independent) correlation coefficients $r_{ij}$ among N performance targets is $N(N-1)/2$. The value of an off-diagonal element is bounded in both directions, $$-1 \leq r_{ik} \leq 1, i,k=1, 2, \ldots, N, i \neq k. \quad (1.4)$$

Figure 2:
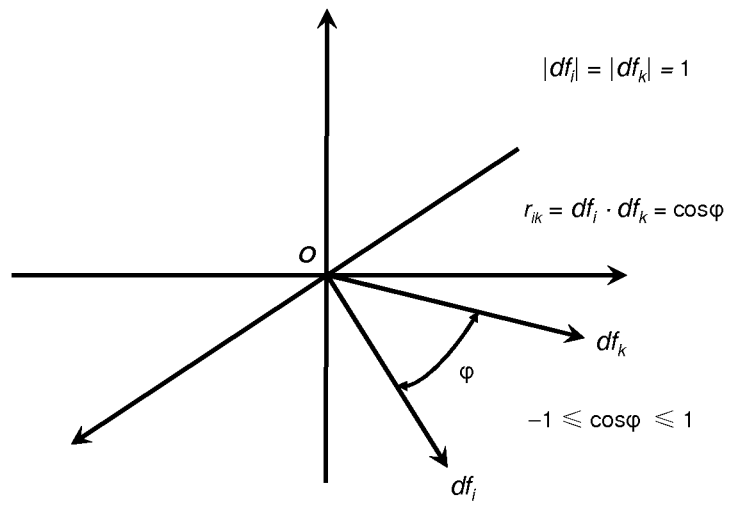
FIG. 2 illustrates a geometric interpretation on correlation coefficient $r_{ij}$ among $k=1, 2, \ldots, N$ performance targets.

A geometric explanation of equation (1.4) which is presented in FIG. 2. To help the explanation, we introduce a normalized variation for each performance target $F_i$, $$df_i = \frac{F_i - \langle F_i \rangle}{S_i}, i = 1, 2, \ldots, N. \quad (1.5)$$

It is easy to see that the mean value of $df_i$ vanishes, $$\langle df_i \rangle =0, i=1, 2, \ldots, N. \quad (1.6)$$

Using Eq. (1.2), we also see that $$\langle df_i \cdot df_i \rangle =1, i=1, 2, \ldots, N, \quad (1.7)$$

i.e., each of $df_i$ can be regarded as a unit vector geometrically. Now, the linear correlation coefficient in Eq. (1.1) can be recast into a much simpler form, $$r_{ik}=r_{ki}=\langle df_i \cdot df_k \rangle, i,k=1, 2, \ldots, N. \quad (1.8)$$

One method of obtaining linear correlation coefficients is by running Monte Carlo simulations. Another method of obtaining linear correlation coefficients is to use the linear sensitivities of performance targets with respect to statistical model parameters. Explicit formula is given in Eq. (3.11) below. Still another method of obtaining linear correlation coefficients is to use the analytic expressions for the relationship between targets and statistical model parameters. Examples include the resistance of a poly or diffused resistor, and the capacitance of metal-insulator-metal capacitor.

Step 22 of FIG. 1 is to check the consistency of all linear correlation coefficients, and make adjustments if necessary. In the presence of other correlation coefficients, the value of a particular correlation coefficient is usually further restricted than (1.4) to within a smaller range. For example, when $r_{13}=0$ (i.e., when $df_1$ and $df_3$ are orthogonal to each other), $r_{12}$ and $r_{23}$ are bounded within a unit circle, $$r_{12}^2 + r_{23}^2 \leq 1, \text{ when } r_{13} = 0 \quad (1.9)$$

Figure 3:
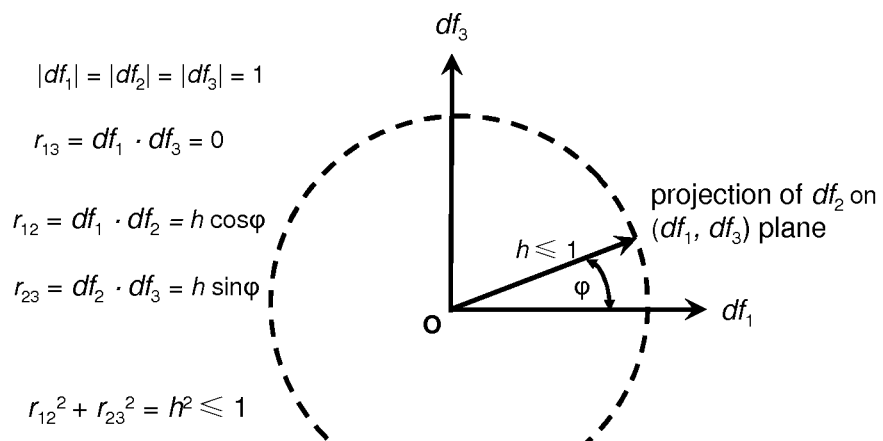
FIG. 3 shows a geometric interpretation on a specified relation among correlation coefficients.

A geometric explanation of inequality (1.9) is given in FIG. 3. In another example, for an arbitrarily given $r_{13}$, if $r_{12}$ and $r_{23}$ are equal (i.e., if the angle between $df_1$ and $df_2$ and the angle between $df_2$ and $df_3$ are the same), then they obey the following relation, $$r_{12}^2 = r_{23}^2 \leq \frac{1}{2}(1 + r_{13}), \text{ when } r_{12} = r_{23}. \quad (1.10)$$

Figures 4, 5:
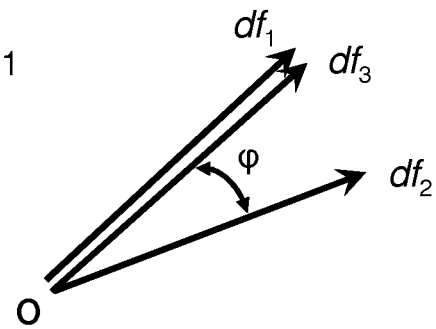
FIG. 4 shows a geometric interpretation on a second relation among correlation coefficients.
FIG. 5 shows a geometric interpretation on a third relation among correlation coefficients.

A geometric explanation of inequality (1.10) is presented in FIG. 4. In a third example, when $r_{13}$ is one (i.e., when $df_1$ and $df_3$ are completely positively correlated), then $r_{12}$ and $r_{23}$ must be equal (i.e., the angle between $df_1$ and $df_2$ and the angle between $df_2$ and $df_3$ must be equal), $$r_{12}=r_{23}, \text{ when } r_{13}=1. \quad (1.11)$$

A geometric explanation of Eq. (1.11) is given in FIG. 5. Most generally, any three correlation coefficients $r_{12}(=a)$, $r_{13}(=b)$, and $r_{23}(=c)$ satisfy the following inequality, $$\Delta \geq 0, \quad (1.12)$$

where $$\Delta \equiv 1+2abc-(a^2+b^2+c^2). \quad (1.13)$$

Figure 6:
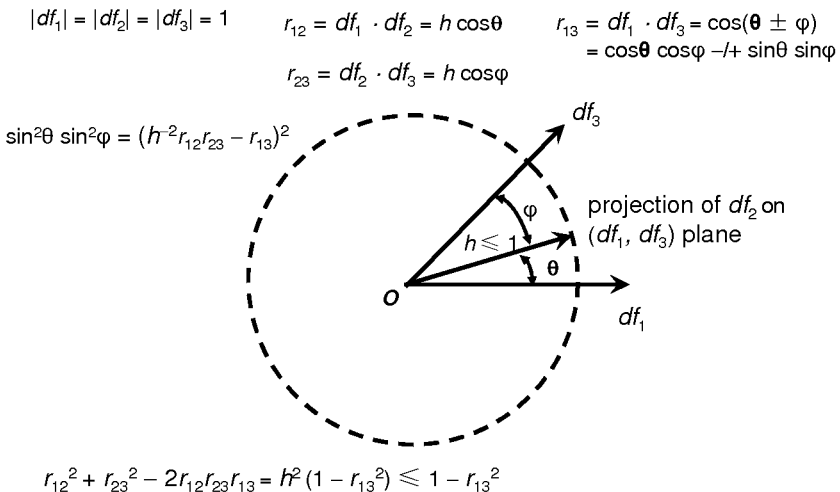
FIG. 6 illustrates a geometric interpretation on a fourth relation among correlation coefficients.

A geometric explanation of inequality (1.12) is given in FIG. 6.

Step 24 is to introduce an N-component vector to represent N $\eta_i$ collectively, $$\eta = \begin{pmatrix} \eta_1 \\ \eta_2 \\ \vdots \\ \eta_N \end{pmatrix}. \quad (1.14)$$

Step 26 is to introduce an N×N symmetric matrix to represent linear correlation coefficients collectively, $$R = \begin{pmatrix} r_{11} & r_{12} & \ldots & r_{1N} \\ r_{21} & r_{22} & \ldots & r_{2N} \\ \vdots & \vdots & \ddots & \vdots \\ r_{N1} & r_{N2} & \ldots & r_{NN} \end{pmatrix} = R^T, \quad (1.15)$$

and then find its inverse $R^{-1}$.

Step 30 is to use the following normalized joint probability density (JPD) to judge whether there exists a suitable common corner for the N multiple targets, $$p = \exp\left(-\frac{1}{2}K^2 \eta^T \cdot R^{-1} \cdot \eta\right). \quad (2.1)$$

The explicit solution of a common corner is not needed here. Also, the number of statistical model parameters is not used in (2.1), and the knowledge of which are those statistical model parameters is not used. The inner product $\eta^T \cdot R^{-1} \cdot \eta$ is actually the square of an optimal corner solution vector, and we will call it "distance squared". When all $\eta_i$'s change their signs, the JPD has the same value, $$p(\eta_1, \eta_2, \ldots, \eta_N) = p(-\eta_1, -\eta_2, \ldots, -\eta_N). \tag{2.2}$$

When a single $\eta_i$ changes its sign, it has the following property, $$p(R; \eta_1, \eta_2, \ldots, \eta_N) = p(R_1; -\eta_1, \eta_2, \ldots, \eta_N), \tag{2.3a}$$

with $$R_1 = \begin{pmatrix} r_{11} & -r_{12} & \ldots & -r_{1N} \\ -r_{21} & r_{22} & \ldots & r_{2N} \\ \vdots & \vdots & \ddots & \vdots \\ -r_{N1} & r_{N2} & \ldots & r_{NN} \end{pmatrix}. \tag{2.3b}$$

A high-bound benchmark value of the normalized JPD is $$p_{max} = \exp\left(-\frac{1}{2}K^2\right). \tag{2.4}$$

which occurs when all off-diagonal elements are approaching +1, and all $\eta_i$'s are equal (either all are +1 or all are −1), $$r_{ik} \approx +1, i,k=1, 2, \ldots, N, i \neq k, \tag{2.5a}$$

$$\eta_1 = \eta_2 = \ldots = \eta_N = \pm 1, i=1, 2, \ldots, N. \tag{2.5b}$$

A middle benchmark value (or, say, a threshold value) of the normalized JPD is $$p_{th} = \exp\left(-\frac{1}{2}NK^2\right), \tag{2.6}$$

which occurs when all off-diagonal elements are zero, i.e., when all performance targets are orthogonal to one another, $$i \neq k. \ r_{ik} = 0, i,k=1, 2, \ldots, N, i \neq k. \tag{2.7}$$

A low-bound benchmark value of the normalized JPD is $$p_{min} = \exp\left(-\frac{1}{2} \cdot (+\infty)\right) = 0, \tag{2.8}$$

which occurs when all off-diagonal elements are approaching +1, but some $\eta_i$'s are +1 and some $\eta_i$'s are −1, $$r_{ik} \approx +1, i,k=1, 2, \ldots, N, i \neq k. \tag{2.9a}$$

There exist $i$ and $k$ such that $\eta_i \neq \eta_k$, $i,k=1, 2, \ldots, N$, $i \neq k$. \tag{2.9b}

N=2 case. In the case of two performance targets, the corresponding matrix is simply $$R = \begin{pmatrix} 1 & r_{12} \\ r_{12} & 1 \end{pmatrix}. \tag{2.10}$$

Its inverse is $$R^{-1} = \frac{1}{1-r_{12}^2} \begin{pmatrix} 1 & -r_{12} \\ -r_{12} & 1 \end{pmatrix}. \tag{2.11}$$

Figure 7:
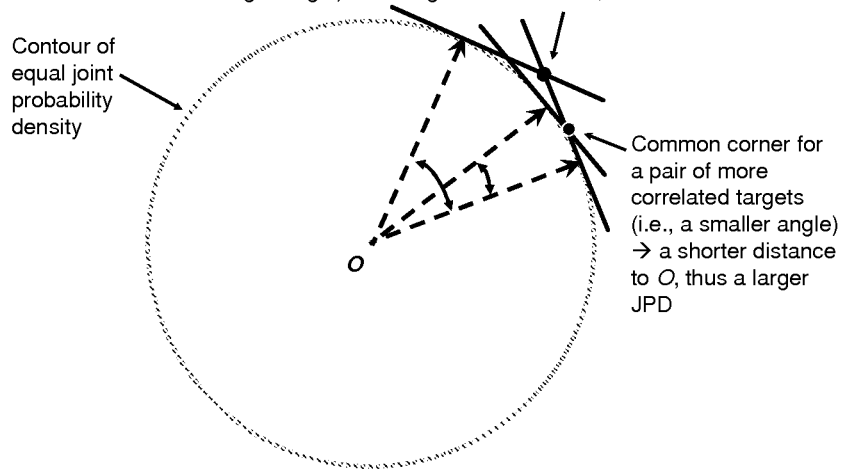
FIG. 7 illustrates a principal that the more correlated a pair of targets, the larger the normalized joint probability density (JPD).

The normalized JPD can be written out explicitly, $$p(\eta_1 = \eta_2) = \exp\left(-\frac{K^2 \eta_1^2}{1+r_{12}}\right) = \exp\left(-\frac{K^2}{1+r_{12}}\right), \tag{2.12a}$$

when $\eta_1 = \eta_2 = \pm 1$, $$p(\eta_1 = \eta_2) = \exp\left(-\frac{K^2 \eta_1^2}{1+r_{12}}\right) = \exp\left(-\frac{K^2}{1+r_{12}}\right), \tag{2.12b}$$

when $\eta_1 = \eta_2 = \pm 1$,

Equation (2.12a) shows that, when the correlation coefficient $r_{12}$ increases, the "distance squared" decreases and the JPD increases. Geometrically, this behavior is depicted in FIG. 7.

When $r_{12}$ is zero, both $p = \exp(-K^2)$, an example for Eq. (2.6).

When $r_{12}$ is 1, $$p(\eta_1 = \eta_2) = \exp\left(-\frac{1}{2}K^2\right),$$

a special case of Eq. (2.4).

When $r_{12}$ approaches unity, $p(\eta_1 = -\eta_2)$ approaches zero, an example for Eq. (2.8).

N=3 case. In the case of three performance targets, the corresponding matrix can be written as $$R = \begin{pmatrix} 1 & a & b \\ a & 1 & c \\ b & c & 1 \end{pmatrix}, \tag{2.13}$$

where we have to use $a = r_{12}$, $b = r_{13}$, $c = r_{23}$ to shorten the expressions below. The inverse of the matrix R is $$R^{-1} = \frac{1}{\Delta} \begin{pmatrix} 1-c^2 & bc-a & ac-b \\ bc-a & 1-b^2 & ab-c \\ ac-b & ab-c & 1-a^2 \end{pmatrix}, \tag{2.14}$$

where $\Delta$ is given in Eq. (1.13). The "distance squared" is thus $$\eta^T \cdot R^{-1} \cdot \eta = \Delta^{-1}[3-(a^2+b^2+c^2)+2\eta_1\eta_2(bc-a)+2\eta_1\eta_3(ac-b)+2\eta_2\eta_3(ab-c)]. \tag{2.15}$$

It has the following properties $$\eta^T \cdot R^{-1} \cdot \eta(a, b, c; \eta_1, \eta_2, \eta_3) = \eta^T \cdot R^{-1} \cdot \eta(a, b, c; -\eta_1, -\eta_2, -\eta_3) = \tag{2.16}$$

$$\eta^T \cdot R^{-1} \cdot \eta(-a, -b, c; -\eta_1, \eta_2, \eta_3) =$$

$$\eta^T \cdot R^{-1} \cdot \eta(-a, -b, c; \eta_1, -\eta_2, -\eta_3) =$$

$$\eta^T \cdot R^{-1} \cdot \eta(-a, b, -c; \eta_1, \eta_2, \eta_3) =$$

-continued $$\eta^T \cdot R^{-1} \cdot \eta(-a, b, -c; -\eta_1, -\eta_2, -\eta_3) =$$
$$\eta^T \cdot R^{-1} \cdot \eta(a, -b, -c; \eta_1, \eta_2, -\eta_3) =$$
$$\eta^T \cdot R^{-1} \cdot \eta(a, -b, -c; -\eta_1, -\eta_2, \eta_3).$$

These are special cases of properties (2.2) and (2.3).

When $a=b=c=0$, we get $\eta^T \cdot R^{-1} \cdot \eta = 3$, and thus, $$p = \exp\left(-\frac{3}{2}K^2\right),$$

independent of $\eta_i$'s value (either +1 or −1), an example of Eq. (2.6).

In a special case of all three correlation coefficients being equal (e.g., a "mismatch" case among device instances), the "distance squared" becomes $$\eta^T \cdot R^{-1} \cdot \eta = \frac{3(1+a) - 2a(\eta_1\eta_2 + \eta_1\eta_3 + \eta_2\eta_3)}{(1+2a)(1-a)}, \quad (2.17)$$
$$a = b = c.$$

Various (eight) combinations of $\eta_i$ (either +1 or −1) lead to only two sets of different values for the "distance squared", $$\eta^T \cdot R^{-1} \cdot \eta = \frac{3}{1+2a}, \quad (2.18a)$$
$$a = b = c,$$
$$\eta_1 = \eta_2 = \eta_3 = \pm 1,$$

$$\eta^T \cdot R^{-1} \cdot \eta = \frac{3+5a}{(1-a)(1+2a)}, \quad (2.18b)$$
$$a = b = c,$$
$$\eta_1 + \eta_2 + \eta_3 = \pm 1.$$

When $a=b=c=1$, $$p(\eta_1 = \eta_2 = \eta_3) = \exp\left(-\frac{1}{2}K^2\right),$$

a special case of Eq. (2.4).

When $a=b=c=1$, $p(\eta_1+\eta_2+\eta_3=\pm 1)=0$, an example for Eq. (2.8).

In another special case of $b=0$ (i.e., $df_1$ and $df_3$ are orthogonal to each other) and $a=c$ (i.e., the angle between $df_1$ and $df_2$ and the angle between $df_2$ and $df_3$ are the same), the "distance squared" becomes $$\eta^T \cdot R^{-1} \cdot \eta = \frac{3 - 2a^2 + 2a^2\eta_1\eta_3 - 2a\eta_2(\eta_1 + \eta_3)}{1 - 2a^2}, \quad (2.19)$$
$$b = 0,$$
$$a = c.$$

Various (eight) combinations of $\eta_i$ (either +1 or −1) lead to only three sets of different values for the "distance squared", $$\eta^T \cdot R^{-1} \cdot \eta = \frac{3-4a}{1-2a^2}, \quad (2.20a)$$
$$b = 0,$$
$$a = c,$$
$$\eta_1 = \eta_2 = \eta_3 = \pm 1,$$

$$\eta^T \cdot R^{-1} \cdot \eta = \frac{3+4a}{1-2a^2}, \quad (2.20b)$$
$$b = 0,$$
$$a = c,$$
$$\eta_1 = \eta_2 = \eta_3 = \pm 1,$$

$$\eta^T \cdot R^{-1} \cdot \eta = 2 + \frac{1}{1-2a^2}, \quad (2.20c)$$
$$b = 0,$$
$$a = c,$$
$$\eta_1 + \eta_3 = 0.$$

Figure 8:
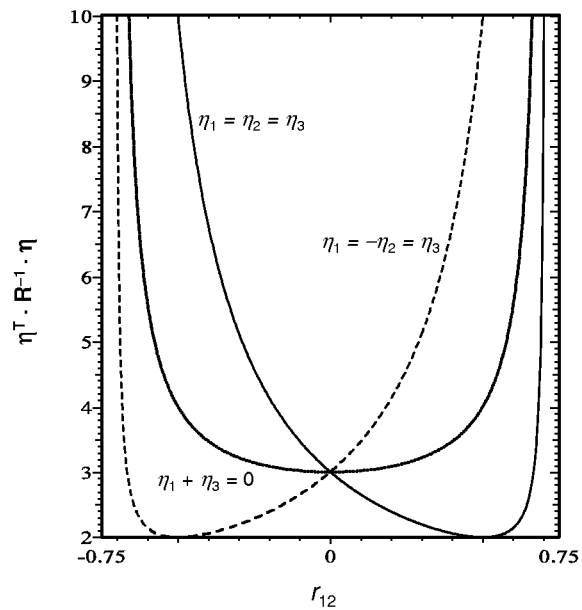
FIG. 8 illustrates a principal that when two correlation coefficients increase, the "distance squared" decreases.
Figure 9:
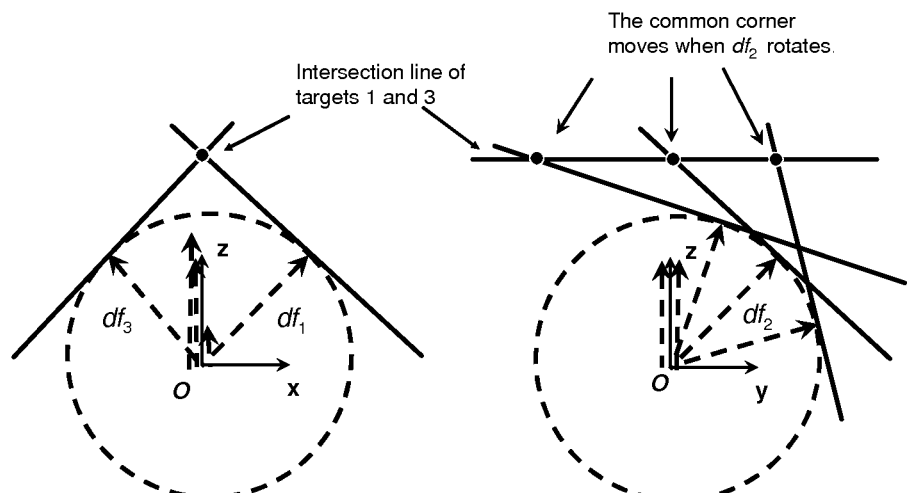
FIG. 9 shows the behavior that when a value $r_{12}$ increases, the distance between a common corner and a center O first decreases and then increases.

We plot Eq. (2.20) in FIG. 8. i) Equation (2.20a) shows that, in the region of $a=c\leq\frac{1}{2}$, when the correlation coefficients a and c increase, the "distance squared" decreases, the same behavior as in the two target case [N=2, see Eq. (2.12a)]. ii) Equation (2.20a) illustrates that, in the region of $a=c\geq\frac{1}{2}$, when the correlation coefficients a and c increase, however, the "distance squared" increases and goes to infinity rapidly when $a=c$ approaches 1. This behavior is opposite to the familiar behavior of two-target case [N=2, see Eq. (2.12a)]. We explain this changing behavior in FIG. 9.

In still another special case of equal $\eta_i$'s, the "distance squared" simplifies to $$\eta^T \cdot R^{-1} \cdot \eta = \Delta^{-1}[3 + 2(ab+ac+bc) - (a^2+b^2+c^2) - 2(a+b+c)], \eta_1 = \eta_2 = \eta_3 = \pm 1. \quad (2.21)$$

We examine two situations in detail.

One situation is $b=0$, which leads to $$\eta^T \cdot R^{-1} \cdot \eta = \frac{3 - 2(a+c) - (a-c)^2}{1 - (a^2+c^2)}, \quad (2.22)$$
$$\eta_1 = \eta_2 = \eta_3 \pm 1,$$
$$b = 0.$$

Figure 10:
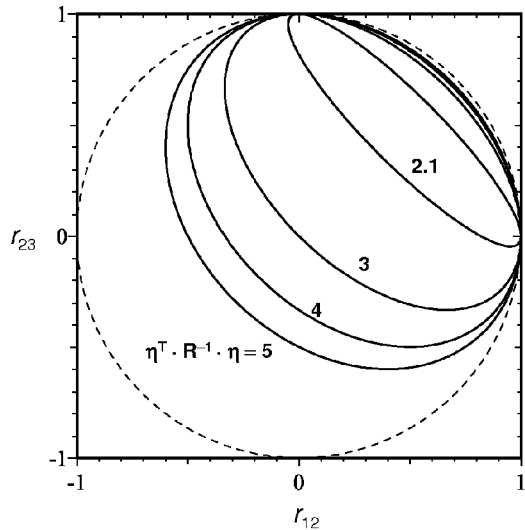
FIG. 10 illustrates a contour of $(\eta^T \cdot R^{-1} \cdot \eta)$ in $(r_{12}, r_{23})$ plane when $r_{13}=0$ and $\eta_1=\eta_2=\eta_3$.

We plot several contours of "distance squared" in FIG. 10. It also shows the counter-intuitive behavior exhibited in Eq. (2.20) [FIG. 8]. For a fixed c value, when a increases, the "distance squared" first decreases but then increases. Similarly, for a fixed a value, when c increases, the "distance squared" first decreases but then increases.

The other situation is $a=c$, for which $$\eta^T \cdot R^{-1} \cdot \eta = \frac{3 + 4ab - b^2 - 4a - 2b}{(1-b)(1+b-2a^2)}, \quad (2.23)$$
$$\eta_1 = \eta_2 = \eta_3 \pm 1,$$
$$a = c.$$

Figure 11:
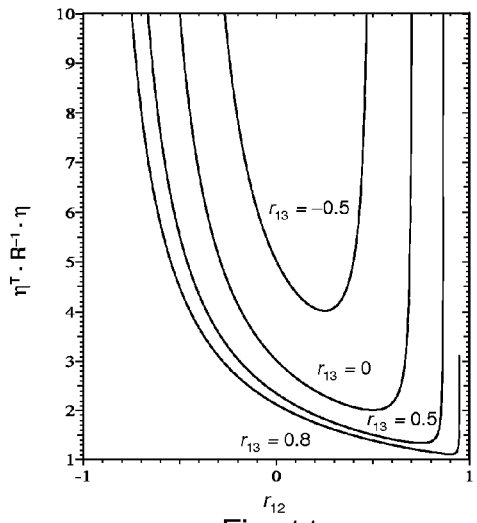
FIG. 11 shows changes in "distance squared" vs. $r_{12}$ when $r_{12}=r_{23}$ and $\eta_1=\eta_2=\eta_3$.

We plot the "distance squared" vs. a for several fixed values of b in FIG. 11. FIG. 11 shows that, for a fixed b value, the "distance squared" first decreases but then increases. FIG. 11 further shows that, even when a, b, and/or c are very close to +1, the "distance squared" can become very large, leading to a very low value of JPD p.

Our criterion to judge whether there exists a suitable common corner is whether $$p \geq p_{th}. \quad (2.24)$$

When $p \geq p_{th}$, there exist one or more suitable common corners (from the view of large enough JPD). When $p < p_{th}$, there is no suitable common corner. In other words, a common corner having $p \geq p_{th}$ can be a suitable common corner (at least from the view of the JPD), and a common corner having $p < p_{th}$ is not a desirable/suitable corner.

Other similar criteria are also possible, such as (2.24) plus each statistical model parameters must be within its K-σ tolerance range ($|u_j| \leq K$). Other examples for a threshold value could be $$p_{th}(N) = \exp\left(-\frac{1}{2}f(N)K^2\right), \quad (2.25)$$

where η(N) is a proper monotonic increasing function of N.

When all choices between the lower and upper bounds for all N targets are specified, all $\eta_i$'s are known and fixed, and the value of the JPD p is unique.

When $p < p_{th}$, there is no suitable common corner, at least from the view point of JPD. Our method of corner model solution is to find a common corner for a subset of N original targets.

The first step of this process is to find a suitable common corner for a set of (N−1) targets. There are N sets of (N−1) targets. We repeat Eqs. (2.1) and (2.6) for the set of (N−1) targets. [Changing N in Eq. (2.6) to (N−1).]

If two or more sets have suitable common corner, we choose a set which has the minimum "distance squared".

If there is still no suitable common corner solution for any set of (N−1) targets, we go on to find a suitable common corner for a set of (N−2) targets. There are N(N−1) sets of (N−2) targets. We repeat this process until we find a subset of targets for which there exists a suitable common corner.

If there is no suitable common corner solution for even two targets, then we find two separate suitable common corners, one for each target. This is always possible.

If the task is to find a single suitable common corner model for the given N targets or one of its largest subset, then we have by now identified a subset of targets for which there exists a suitable common corner.

If the task is to find one or more suitable common corner models for all N targets, then we go to find a second common corner for the rest of targets not covered by the first common corner. And repeat this process until all N targets are covered.

When the task is to build a set of corner models to cover both the lower- and upper-bound corners of I performance targets, there are N=2I performance corners to cover. In this case, we have the freedom to choose the combination of one target's lower-bound corner with another target's either lower- or upper-bound corner. We first decide which combination of lower- and upper-bound corners of I targets will give a suitable common corner.

Choosing different values of $\eta_i$(+1 or −1), the normalized JPD p will have different values. There are $2^N$ combinations for $\eta_1, \eta_2, \ldots, \eta_N$. There are $2^{N-1}$ different values for the normalized JPD p. First, we search a set of $\eta_i$(+1 or −1) that has the large p value among all combinations of $\eta_1, \eta_2, \ldots, \eta_N$. Next, we check whether this p value satisfies the criterion Eq. (2.24). Then, we proceed forward using the method discussed above.

Figure 12:
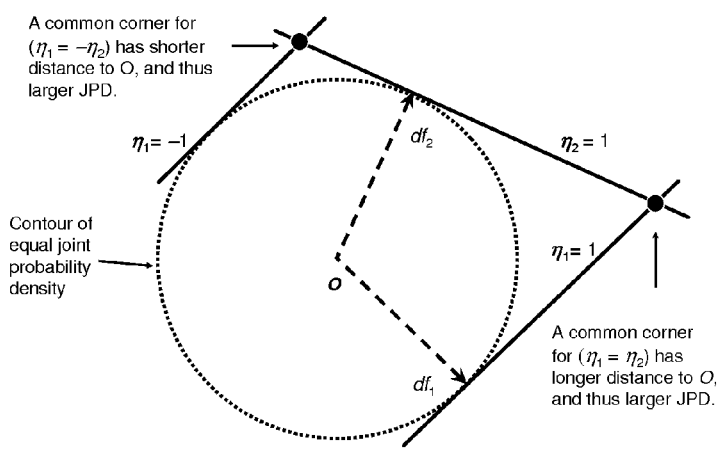
FIG. 12 shows common corners for a pair of negatively correlated targets.

In the N=2 example above, when the pair of targets are positively correlated ($r_{12} > 0$), we find that $p(\eta_1 = \eta_2) > p(\eta_1 = -\eta_2)$, and a common corner should be constructed from $\eta_1 = \eta_2 = 1$ and another common corner from $\eta_1 = \eta_2 = -1$. When the pair of targets are negatively correlated ($r_{12} < 0$), we realize that $p(\eta_1 = -\eta_2) > p(\eta_1 = \eta_2)$. In this case, a common corner should be constructed from $\eta_1 = -\eta_2 = 1$ and another common corner from $\eta_1 = -\eta_2 = -1$ [see FIG. 12].

An N=3 example of $r_{13} = 0$ and $r_{12} = r_{23}$ [see Eqs. (2.20) and FIG. 8]. When $r_{12} = r_{23} > 0$, we find that a common corner should be constructed from $\eta_1 = \eta_2 = \eta_3 = 1$ and another common corner from $\eta_1 = \eta_2 = \eta_3 = -1$. When $r_{12} = r_{23} < 0$, a common corner should be constructed from $\eta_1 = -\eta_2 = 1$ and another common corner from $\eta_1 = -\eta_2 = \eta_3 = -1$.

After determining for which set of targets to construct a common corner model and determining the selection of the lower- or upper-bound corner for each target, then we proceed to find a specific solution of the common corner using the method as summarized below. When it is possible, we re-cast the solutions in the invention in the form of vectors and matrices.

Discussed below is a preferred procedure to identify a subset of independent statistical model parameters among all statistical model parameters. Each independent statistical model parameter in the subset affects one or more performance targets under study. Let the number of independent statistical model parameters in the subset be M, and parameter names are denoted by $x_1, x_2, \ldots, x_M$. Let the nominal value and the standard deviation of the jth statistical model parameter be $x_{j0}$ and $\sigma_j$ (j=1, 2, ..., M), respectively. We first introduce M normalized statistical model parameters, $$u_j = (x_j - x_{j0})\sigma_j, j=1, 2, \ldots, M. \quad (3.1)$$

Each of them is a dimensionless quantity. Collectively, they span an M-dimensional space. We next introduce a vector $u = (u_1, u_2, \ldots, u_M)_T$ in the M-dimensional space to represent the M normalized statistical model parameters collectively.

For each performance target $F_i$, construct its linear representation in terms of M statistical model parameters ($x_1, x_2, \ldots, x_M$) around the normal point ($x_{10}, x_{20}, \ldots, x_{M0}$), $$F_i(x_1, x_2, \ldots, x_M) = F_{i0} + \sum_{j=1}^{M} a_{ij}(x_j - x_{j0}) = F_{i0} + \sum_{j=1}^{M} a_{ij}\sigma_j u_j, \quad (3.2)$$

$$i = 1, 2, \ldots, N,$$

where $$F_{i0} = F_i(x_{10}, x_{20}, \ldots, x_{M0}), i=1, 2, \ldots, N, \quad (3.3)$$

are nominal performance targets.

The linear coefficients a in Eq. (3.2) can be found by sensitivity analyses, $$a_{ij} = [F_i(x_{10}, x_{20}, \ldots, x_{j0}+n\sigma_j, \ldots, x_{M0}) - F_{i0}]/(n\sigma_j),$$
$$i=1, 2, \ldots, N, j=1, 2, \ldots, M, \quad (3.4)$$

where n can be 1, −1, 2, −2, 3, −3, or many other discrete values. Each linear/sensitivity coefficient $a_{ij}$ could be positive, zero, or negative.

Under the linear representation (3.2), the standard deviation of the $i^{th}$ performance target is found to be $$S_i = \sqrt{\langle F_i^2 \rangle - \langle F_i \rangle^2} = \sqrt{\sum_{j=1}^{M} a_{ij}^2 \sigma_j^2}, \quad (3.5)$$

$i = 1, 2, \ldots, N.$

Introduce a set of normalized sensitivities, $$\alpha_{ij} = \frac{a_{ij}\sigma_j}{S_i}, \quad (3.6)$$

$i = 1, 2, \ldots, N,$
$j = 1, 2, \ldots, M.$

Further introduce a set of vectors $\alpha_i = (\alpha_{i1}, \alpha_{i2}, \ldots, \alpha_{iM})^T$ in the M-dimensional space. Using Eq. (3.5), we find that $$|\alpha_i|^2 = \alpha_i^T \cdot \alpha_i = \sum_{j=1}^{M} \alpha_{ij}^2 = 1, \quad (3.7)$$

$i = 1, 2, \ldots, N.$

Namely, the length of each vector $\alpha_i$ is 1, $|\alpha_i|=1$.

Using Eq. (3.6), the normalized variation (1.5) for each performance target $F_i$ becomes $$df_i = \sum_{j=1}^{M} \alpha_{ij} u_j, \quad (3.8)$$

$i = 1, 2, \ldots, N.$

The K-σ corner conditions for N performance targets are $$\sum_{j=1}^{M} \alpha_{ij} u_j = K\eta_i, \quad (3.9)$$

$i = 1, 2, \ldots, N.$

We introduce an N×M matrix for normalized linear sensitivities, $$A = \begin{pmatrix} \alpha_{11} & \alpha_{12} & \cdots & \alpha_{1M} \\ \alpha_{21} & \alpha_{22} & \cdots & \alpha_{2M} \\ \vdots & \vdots & \ddots & \vdots \\ \alpha_{N1} & \alpha_{N2} & \cdots & \alpha_{NM} \end{pmatrix} = \begin{pmatrix} \alpha_1^T \\ \alpha_2^T \\ \vdots \\ \alpha_N^T \end{pmatrix}. \quad (3.10)$$

We can now write N linear algebraic equations (3.9) for the N performance targets' corner conditions in a matrix form, $$A \cdot u = K\eta. \quad (3.11)$$

Making use of Eqs. (1.8) and (3.8), the linear correlation coefficient (1.1) between the $i^{th}$ and $k^{th}$ targets is related to the corresponding normalized sensitivities, $$r_{ik} = \sum_{j=1}^{M} \alpha_{ij} \alpha_{kj} = \alpha_i^T \cdot \alpha_k, \quad (3.12)$$

$i, k = 1, 2, \ldots, N.$

We can re-write relation (3.12) in a matrix form, $$R = A \cdot A^T. \quad (3.13)$$

Based on property (3.7), each diagonal coefficient (self correlation coefficient) is unity, $r_{ii}=1$, as expected.

N=M case. When N=M, Eqs. (3.11) contain N linear algebraic equations for M=N unknowns, $u=(u_1, u_2, \ldots, u_N)$, which can be solved exactly and straightforwardly. Using the matrix formalism, the solution for Eq. (3.11) is $$u = KA^{-1} \cdot \eta, \quad (3.14)$$

which provides a common corner for the N performance targets simultaneously. Corresponding normalized JPD equals the value in Eq. (2.1), $$p = \exp\left(-\frac{1}{2} u^T \cdot u\right) = \exp\left(-\frac{1}{2} K^2 \eta^T \cdot R^{-1} \cdot \eta\right). \quad (3.15)$$

N<M case. When the number of equations, M, is smaller than the number of statistical model parameters, N, there are infinite sets of solutions (i.e., common corners). Among those sets of solutions, there is a set of optimal solution. The optimal solution is found by maximizing the joint probability density under the restriction of Eq. (3.11), i.e., by minimizing (the square of) the distance to the nominal point, $\Sigma u_j^2$, under the restriction of Eq. (3.11). In the matrix form, the common and optimal corner solution is $$u = KA^T \cdot R^{-1} \cdot \eta. \quad (3.16)$$

Corresponding normalized JPD also equals the value in Eq. (2.1).

When N=M, the matrix A becomes a square matrix and solution (3.16) for N<M reduces to solution (3.14). In other words, solution (3.16) is also valid for N=M.

Figure 13:
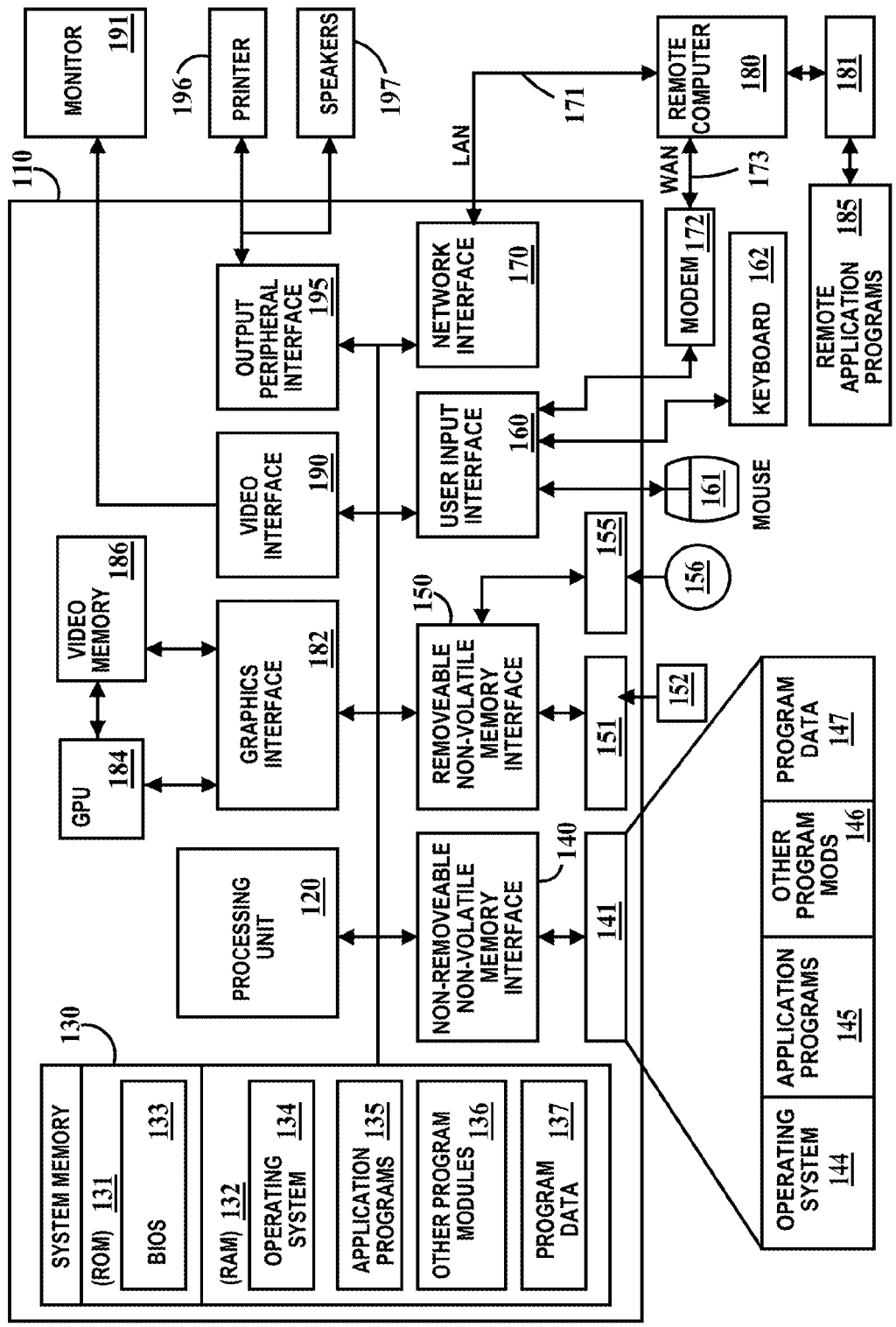
FIG. 13 illustrates a computing environment in which the present invention may be implemented.

For example, FIG. 13 and the following discussion provide a brief general description of a suitable computing environment in which the invention may be implemented. While a general-purpose computer is described below, this is but one example, the present invention may be implemented in an environment of networked hosted services in which very little or minimal client resources are implicated, e.g., a networked environment in which the client device serves merely as a browser or interface to the World Wide Web. It should also be understood that handheld, portable, and other computing devices of all kinds are contemplated for use in connection with the present invention.

Although not required, the invention can be implemented via an application-programming interface (API), for use by a developer, and/or included within the network browsing software, which will be described in the general context of computer-executable instructions, such as program modules, being executed by one or more computers, such as client workstations, servers, or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations.

Other well known computing systems, environments, and/or configurations that may be suitable for use with the invention include, but are not limited to, personal computers (PCs), server computers, hand-held or laptop devices, multi-processor systems, microprocessor-based systems, programmable consumer electronics, network PCs, minicomputers, mainframe computers, and the like. The invention may also be practiced in distributed computing environments where tasks are performed by remote processing devices that are linked through a communications network or other data transmission medium. In a distributed computing environment, program modules may be located in both local and remote computer storage media including memory storage devices.

FIG. 13, thus, illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 13, an exemplary system for implementing the invention includes a general purpose-computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 110.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 13 illustrates operating system 134, application programs 135, other program modules 136, and program data 137.

The computer 110 may also include other removable/non-removable, volatile/nonvolatile computer storage media. By way of example only, FIGS. 4-6 illustrate a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 13 provide storage of computer readable instructions, data structures, program modules and other data for the computer 110. In FIG. 13, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies.

A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB).

A monitor 191 or other type of display device is also connected to the system bus 121 via an interface, such as a video interface 190. A graphics interface 182, such as Northbridge, may also be connected to the system bus 121. Northbridge is a chipset that communicates with the CPU, or host-processing unit 120, and assumes responsibility for accelerated graphics port (AGP) communications. One or more graphics processing units (GPUs) 684 may communicate with graphics interface 182. In this regard, GPUs 184 generally include on-chip memory storage, such as register storage and GPUs 184 communicate with a video memory 186. GPUs 184, however, are but one example of a coprocessor and thus a variety of co-processing devices may be included in computer 110. A monitor 191 or other type of display device is also connected to the system bus 121 via an interface, such as a video interface 190, which may in turn communicate with video memory 186. In addition to monitor 691, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 13. The logical connections depicted in FIG. 13 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 13 illustrates remote application programs 185 as residing on memory device 181. It will be appreciated that the network connections shown are exemplary and other means of establishing a communications link between the computers may be used.

One of ordinary skill in the art can appreciate that a computer 110 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and execution capabilities.

As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A computer-implemented method of constructing a corner model for multiple performance targets for circuit simulations, comprising:

identifying N, where N is an integer$\geq 2$, device and/or circuit performance targets $F_1, F_2, \ldots, F_N$, and obtaining their correlation matrix $R_{N \times N}$ using Monte Carlo simulations, analyzing measured hardware data, or using the linear sensitivities of the N performance targets on M statistical model parameters;

establishing a formalism of calculating a normalized joint probability density (JPD);

setting a set of threshold values for normalized joint probability densities;

determining the smallest number J of corner models needed to represent K-$\sigma$ lower or upper bounds of the N performance targets where K is a number that sets an accumulated probability target;

for each corner model of said J corner models, determining which performance targets it represents;

constructing, using a computer, an optimal common corner solution for each of J corner models by maximizing normalized joint probability density among all possible common corner solutions for that corner;

wherein setting a set of threshold values for normalized joint probability densities comprises setting $$p_{th}(N) = \exp\left(-\frac{1}{2}f(N)K^2\right),$$

where $f(N)$ is a proper monotonic increasing function of N and $p_{th}(N)$ is a normalized joint probability density corresponding to middle benchmark value; and storing the corner model and corner solution on the computer or a computer-readable non-transitory storage medium.

2. The method of claim 1, wherein establishing a formalism of calculating a normalized joint probability density comprises setting the value of the parameter K, for the $i^{th}$ of the N=1 to N=i performance targets, setting $\eta_i$=+1 for its K-$\sigma$ upper performance corner and $\eta_i$=1 for its K-$\sigma$ lower performance corner, and using the formalism $$p(N) = \exp\left(-\frac{1}{2}K^2 \eta_N^T \cdot R_{N \times N}^{-1} \cdot \eta_N\right)$$

to calculate a normalized joint probability density p(N), where $\eta_N = (\eta_1, \eta_2, \ldots, \eta_N)^T$ is an N-component vector.

3. The method of claim 1, wherein determining the smallest number J of corner models needed to represent K-σ lower and/or upper bounds of the N performance targets comprises classifying a corner model task based on in a first case both the lower performance corner $\eta_i=+1$ and upper performance corner $\eta_i=-1$ are to be represented in corner models or in a second case just the upper performance corner $\eta_i=+1$ or just the lower performance corner $\eta_i=-1$ is to be represented in one or more corner models, and further based on whether the corner model task is to find a single corner model to represent as many performance targets of the N performance targets as possible or to use a set of corner models to represent all of the N performance targets.

4. The method of claim 3, further including:
in the second case testing whether $p(N) \geq p_{th}(N)$, where p (N) is a normalized joint probability density corresponding to N performance corners, is satisfied or not, and if it is not satisfied, further including finding a largest set of I targets which has highest normalized joint probability density p(I) among $N!/[(N-I)!I!]$ combination of I logic circuits and/or standard cells and also satisfies $p(I) \geq p_{th}(I)$, where p (I) is a normalized joint probability density corresponding to I targets by trying I=N−1 first, and then if still not possible, trying I=N−2, N−3, . . . .

5. The method of claim 3, further including:
in the second case, the step of determining the smallest number J of corner models further comprises a step of finding the smallest number J of corners which can cover all N targets collectively, and further comprises finding a best allocation of N targets into J groups $(n_1+n_2+ \ldots +n_J=N)$ and having $p(I_j) \geq p_{th}(I_j)$ for each group (j=1, 2, . . . , N) where p ($I_j$) is a normalized joint probability density corresponding to I targets and J corner models.

6. The method of claim 3, further including:
in the first case the step of determining for which performance targets a corner model represents comprises first searching and finding the largest p(N) among $2^{N-1}$ combinations: $\eta_1=1, \eta_2=\pm 1, \ldots, \eta_N=\pm 1$ and selecting the corresponding combination as $(\eta_1, \eta_2, \ldots, \eta_N)= (1, \tilde{\eta}_2, \ldots, \tilde{\eta}_N)$; and
wherein p (N) is a normalized joint probability density corresponding to N performance corners.

7. The method of claim 6, in the case of both the lower and upper performance corners (i.e., both $\eta_i=+1$ and $\eta_i=-1$ performance corners) needing to be represented by a set of corner models, wherein the step of determining for which performance targets a corner model represents further comprises finding the smallest number (J) of corner models needed and, for each of J corner models, determining for which performance targets it represents for $(1, \tilde{\eta}_2, \ldots, \tilde{\eta}_N)$, satisfying $n_1+n_2+ \ldots +n_J=N$.

8. The method of claim 7, in the case of both the lower and upper performance corners, wherein both $\eta_i=+1$ and $\eta_i=-1$ performance corners, needing to be represented by a set of corner models, after the step of finding the division of N performance targets $(1, \tilde{\eta}_2, \ldots, \tilde{\eta}_N)$ into J sub-groups satisfying $n_1+n_2+ \ldots +n_J=N$, further comprises mapping or dividing N performance targets $(-1, -\tilde{\eta}_2, \ldots, -\tilde{\eta}_N)$ into similar J sub-groups while still satisfying $n_1+n_2+ \ldots +n_J=N$.

9. The method of claim 1, wherein constructing an optimal common corner solution for each of J corner models $(n_1+n_2+ \ldots +n_J=N)$ comprises maximizing a JPD among all possible common corner solutions for that corner subject to involved $n_j$ corner conditions.

10. The method of claim 9, further including:
after obtaining a corner solution for a combination $(\eta_1, \eta_2, \ldots, \eta_N)$, reversing its skewing and using it as the corresponding corner solution for an opposite combination $(-\eta_1, -\eta_2, \ldots, -\eta_N)$.

11. A computer system comprising a processor, a memory coupled to the processor, and a computer readable storage device coupled to the processor, said storage device containing program code configured to be executed by the processor via the memory to implement a method for constructing a corner model for multiple performance targets for circuit simulations, said method comprising:
identifying N, where N is an integer $\geq 2$, device and/or circuit performance targets $F_1, F_2, \ldots, F_N$, and obtaining their correlation matrix $R_{N \times N}$ using Monte Carlo simulations, analyzing measured hardware data, or using the linear sensitivities of the N performance targets on M statistical model parameters;
establishing a formalism of calculating a normalized joint probability density (JPD);
setting a set of threshold values for normalized joint probability densities;
determining the smallest number J of corner models needed to represent K-σ lower or upper bounds of the N performance targets where K is a number that sets an accumulated probability target;
for each corner model of said J corner models, determining which performance targets it represents;
constructing an optimal common corner solution for each of J corner models by maximizing said normalized joint probability density among all possible common corner solutions for that corner; and
wherein setting a set of threshold values for normalized joint probability densities comprises setting $$p_{th}(N) = \exp\left(-\frac{1}{2}f(N)K^2\right),$$

where $f(N)$ is a proper monotonic increasing function of N and $p_{th}$ (N) is a normalized joint probability density corresponding to middle benchmark value.

12. The system according to claim 11, wherein the step of establishing a formalism of calculating a normalized joint probability density comprises setting the value of the parameter K, for the $i^{th}$ of the N=1 to N=i performance targets, setting $\eta_i=+1$ for its K-σ upper performance corner and $\eta_i=-1$ for its K-σ lower performance corner, and using the formalism $$p(N) = \exp\left(-\frac{1}{2}K^2 \eta_N^T \cdot R_{N \times N}^{-1} \cdot \eta_N\right)$$

to calculate a normalized joint probability density p(N), where $\eta_N=(\eta_1, \eta_2, \ldots, \eta_N)^T$ is an N-component vector.

13. The system according to claim 11, wherein the step of determining the smallest number J of corner models needed to represent K-σ lower and/or upper bounds of the N performance targets comprises classifying a corner model task based on in a first case both the lower performance corner $\eta_i=+1$ and upper performance corner $\eta_i=-1$ are to be represented in corner models or in a second case just the upper performance corner $\eta_i=\pm 1$ or just the lower performance corner $\eta_i=-1$ is to be represented in one or more corner models, and further based on whether the corner model task is to find a single corner model to represent as many performance targets of the N performance targets as possible or to use a set of corner models to represent all of the N performance targets.

14. The system according to claim 11, wherein the step of constructing an optimal common corner solution for each of J corner models ($n_1+n_2+\ldots+n_J=N$) comprises maximizing a JPD among all possible common corner solutions for that corner subject to involved $n_j$ corner conditions.

15. The system of claim 14, the method further including: after obtaining a corner solution for a combination ($\eta_1, \eta_2, \ldots, \eta_N$), reversing its skewing and using it as the corresponding corner solution for an opposite combination ($-\eta_1, -\eta_2, \ldots, -\eta_N$).

16. A computer program product, comprising:
a computer usable non-transitory storage device having a computer readable program code embodied therein, said computer readable program code comprising an algorithm adapted to implement a method of constructing a corner model for multiple performance targets for circuit simulations, said method comprising the steps of:
identifying N, where N is an integer≧2, device and/or circuit performance targets $F_1, F_2, \ldots, F_N$, and obtaining their correlation matrix $R_{N \times N}$ using Monte Carlo simulations, analyzing measured hardware data, or using the linear sensitivities of the N performance targets on M statistical model parameters;
establishing a formalism of calculating a normalized joint probability density (JPD);
setting a set of threshold values for normalized joint probability densities;
determining the smallest number J of corner models needed to represent K-σ lower or upper bounds of the N performance targets where K is a number that sets an accumulated probability target;
for each corner model of said J corner models, determining which performance targets it represents;
constructing an optimal common corner solution for each of J corner models by maximizing said normalized joint probability density among all possible common corner solutions for that corner; and
wherein setting a set of threshold values for normalized joint probability densities comprises setting $$p_{th}(N) = \exp\left(-\frac{1}{2}f(N)K^2\right),$$

where $f(N)$ is a proper monotonic increasing function of N and $p_{th}(N)$ is a normalized joint probability density corresponding to middle benchmark value.

17. The article of manufacture according to claim 16, wherein the method step of establishing a formalism of calculating a normalized joint probability density comprises setting the value of the parameter K, for the $i^{th}$ of the N=1 to N=i performance targets, setting $\eta_i=+1$ for its K-σ upper performance corner and $\eta_i=-1$ for its K-σ lower performance corner, and using the formalism $$p(N) = \exp\left(-\frac{1}{2}K^2\eta_N^T \cdot R_{N \times N}^{-1} \cdot \eta_N\right)$$

to calculate a normalized joint probability density p(N), where $\eta_N=(\eta_1, \eta_2, \ldots, \eta_N)^T$ is an N-component vector.

18. The article of manufacture according to claim 16, wherein the method step of determining the smallest number J of corner models needed to represent K-σ lower and/or upper bounds of the N performance targets comprises classifying a corner model task based on in a first case both the lower performance corner $\eta_i=+1$ and upper performance corner $\eta_i=1$ are to be represented in corner models or in a second case just the upper performance corner $\eta_i=+1$ or just the lower performance corner $\eta_i=-1$ is to be represented in one or more corner models, and further based on whether the corner model task is to find a single corner model to represent as many performance targets of the N performance targets as possible or to use a set of corner models to represent all of the N performance targets.

19. The article of manufacture according to claim 16, wherein the method step of constructing an optimal common corner solution for each of J corner models ($n_1+n_2+\ldots+n_J=N$) comprises maximizing a JPD among all possible common corner solutions for that corner subject to involved $n_j$ corner conditions.

20. The system of claim 19, the method further including:
after obtaining a corner solution for a combination ($\eta_1, \eta_2, \ldots, \eta_N$), reversing its skewing and using it as the corresponding corner solution for an opposite combination ($-\eta_1, -\eta_2, \ldots, -\eta_N$).

* * * * *